(12) United States Patent
Kumar (10) Patent No.: US 11,223,345 B2
(45) Date of Patent: Jan. 11, 2022

(54) LOW POWER INPUT RECEIVER USING A SCHMITT TRIGGER CIRCUIT (71) Applicant: STMicroelectronics International N.V., Geneva (CH)

(72) Inventor: Manoj Kumar, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/328,525

(22) Filed: May 24, 2021

(65) Prior Publication Data

US 2021/0384895 A1    Dec. 9, 2021

Related U.S. Application Data (60) Provisional application No. 63/034,492, filed on Jun. 4, 2020.

(51) Int. Cl.
H03K 3/037    (2006.01)
(52) U.S. Cl.
CPC .................. H03K 3/0377 (2013.01)
(58) Field of Classification Search
CPC .................................................. H03K 3/0377
USPC ................................................. 327/205, 206
See application file for complete search history.

(56) References Cited

U.S. PATENT DOCUMENTS

| | | | | |
|---|---|---|---|---|
| 5,341,033 A * | 8/1994 | Koker | ............ | H03K 3/013 327/206 |
| 5,945,859 A * | 8/1999 | Pang | ............ | H03K 3/3565 327/206 |
| 6,356,099 B1 * | 3/2002 | Lee | ............ | H03K 3/3565 326/24 |
| 6,448,830 B1 * | 9/2002 | Chuang | ............ | H03K 3/3565 327/205 |
| 7,167,036 B2 * | 1/2007 | Fournel | ............ | H03K 19/0013 326/81 |
| 7,525,350 B2 | 4/2009 | Zeng et al. | | |
| 8,981,840 B1 | 3/2015 | Tyrrell et al. | | |
| 9,306,550 B2 * | 4/2016 | Kumar | ............ | H03K 3/3565 |
| 9,760,108 B2 | 9/2017 | Liu | | |
| 10,452,113 B2 | 10/2019 | Au Yeung et al. | | |
| 10,545,527 B2 | 1/2020 | Hallikainen | | |
| 2012/0229182 A1 | 9/2012 | Lin et al. | | |
| 2016/0182022 A1 * | 6/2016 | Kumar | ............ | H03K 3/3565 327/206 |
| 2020/0059224 A1 | 2/2020 | Jiang et al. | | |

* cited by examiner

Primary Examiner — Tomi Skibinski
(74) Attorney, Agent, or Firm — Crowe & Dunlevy (57) ABSTRACT An input signal having a logic low level at a first voltage and a logic high level at a second voltage is received by a Schmitt trigger. A voltage generator outputs a reference voltage generated from a third voltage that is higher than the second voltage. A first transistor coupled between the third voltage and a power supply node of the Schmitt trigger is biased by the reference voltage to apply a fourth voltage to the power supply node of the Schmitt trigger that is dependent on the reference voltage. The reference voltage has a value which causes the fourth voltage to be less than or equal to the second voltage. A second transistor coupled between the input signal and the input of the Schmitt trigger circuit is also biased by the reference voltage to control the logic high level voltage of the input signal at the Schmitt trigger.

20 Claims, 5 Drawing Sheets

LOW POWER INPUT RECEIVER USING A SCHMITT TRIGGER CIRCUIT

CROSS-REFERENCE TO RELATED APPLICATIONS

This application claims priority from U.S. Provisional Application Patent No. 63/034,492, filed Jun. 4, 2020, the disclosure of which is hereby incorporated by reference.

TECHNICAL FIELD

The present invention generally relates to an input receiver circuit for use in input/output (I/O) circuitry of an integrated circuit device and, in particular, to a low power input receiver circuit utilizing a Schmitt trigger circuit.

BACKGROUND

Figure 1:
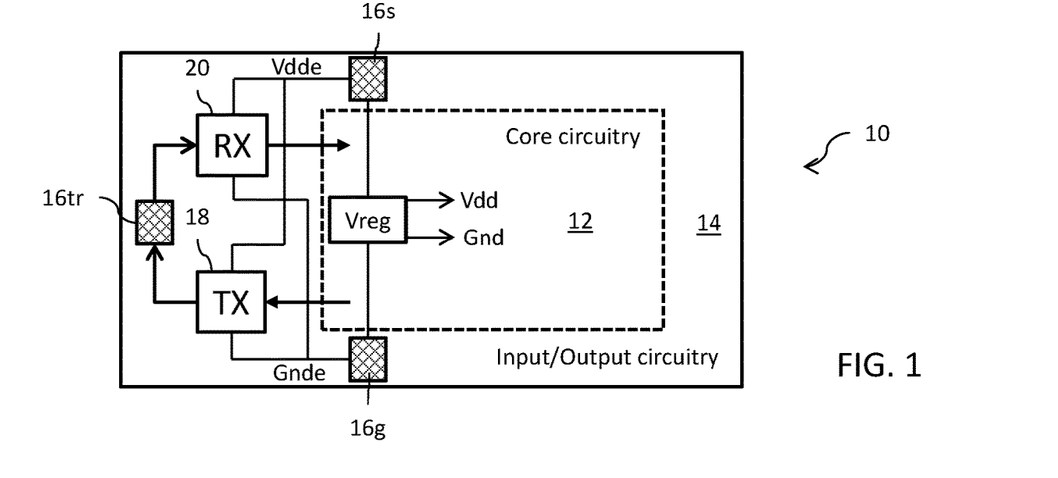
FIG. 1 shows a simplified block diagram of an integrated circuit device.

Reference is made to FIG. 1 which shows a simplified block diagram of an integrated circuit device 10. The integrated circuit device 10 includes a central region 12, also referred to a core region, including functional integrated circuits (of either or both analog or digital type; for example, amplifiers, filters, oscillators, logic circuits, processors, etc.). The integrated circuit device 10 further includes a peripheral region 14 including input/output (I/O) circuits. The integrated circuit device 10 interfaces with the outside environment through electrical connection pads (or pins) 16 which are arranged in the peripheral region 14. The pads 16 may, for example, include pads for connection to an external power supply (such pads including, for example, positive/negative supply voltage pads 16s and ground/reference voltage pads 16g) as well as pads associated with the transmission/reception of analog and/or digital signals (such pads including, for example, input/output pad 16tr for importing and exporting signals). The I/O circuits of the peripheral region 14 include a transmit (TX) circuit 18 which interfaces the functional integrated circuits of the central (core) region 12 with the input/output pad 16tr, and a receive (RX) circuit 20 which interfaces the input/output pad 16tr with the functional integrated circuits of the central (core) region 12.

The TX and RX circuits 18 and 20 may, for example, be powered from a power supply domain that is unique to the peripheral region 14. In other words, the I/O circuits of the peripheral region 14 may utilize supply voltage levels which are different from the supply voltage levels used by the functional integrated circuits of the central (core) region 12. As an example of this, the power supply domain for the peripheral region 14 may be a 3.3V/ground domain while the power supply domain for the central (core) region 12 may instead be a 1.8V/ground domain (or 1.2V/ground domain). The positive/negative supply voltage pad 16s and ground/reference voltage pad 16g may thus be connectable to a power supply (external) providing the 3.6V/ground voltages, with the TX and RX circuits 18 and 20 receiving their power (Vdde and Gnde) from the pads 16s and 16g. The 1.8V/ground voltages used by the central (core) region 12 may be supplied in a similar manner from off-chip (in which case further positive/negative supply voltage pads and ground/reference voltage pads would be needed in the peripheral region 14—not shown), but in a more common case the power supply (Vdd and Gnd) for the central (core) region 12 is generated on-chip by a voltage regulator (Vreg) circuit which is powered from the pads 16s and 16g.

Figure 2:
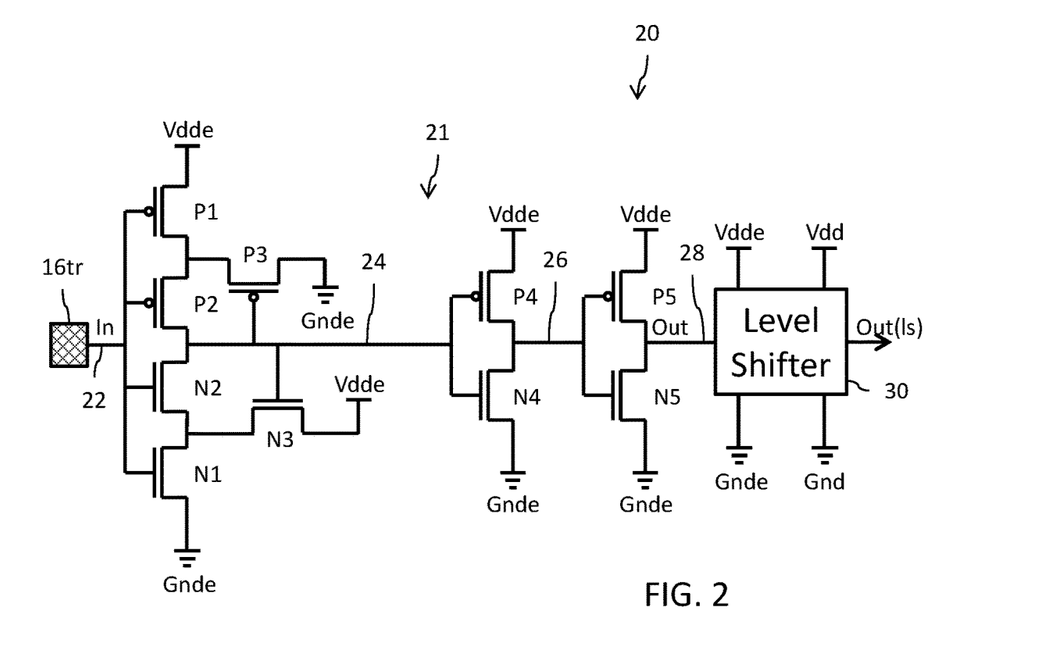
FIG. 2 shows a circuit diagram for a receiver circuit which includes a Schmitt trigger circuit.

Reference is now made to FIG. 2 which shows a circuit diagram for an RX circuit 20. The RX circuit 20 includes a Schmitt trigger circuit 21. The Schmitt trigger 21 has a first inverter stage including PMOS transistors P1 and P2 and NMOS transistors N1 and N2 that are coupled in series with each other through their source-drain paths. The source of transistor P1 is coupled to the high supply voltage Vdde. The drain of the transistor P1 is coupled to the source of the transistor P2. The drain of the transistor P2 is coupled to the drain of the transistor N2. The drains of the transistors N2 and P2 correspond to the output node 24 of the first inverter stage of the Schmitt trigger 21. The source of the transistor N2 is coupled to the drain of the transistor N1. The source of the transistor N1 is coupled to the low supply voltage Gnde. The gate terminals of the transistors P1, P2, N1, N2 are all coupled to receive an input signal In at an input node 22 from the pad 16tr. Although not specifically illustrated, the body terminal of transistor P1 is coupled to Vdde, the body terminal of transistor P2 is coupled to the source of transistor P2, and the body terminals of the transistors N1 and N2 are coupled to Gnde.

The Schmitt trigger 21 further includes feedback circuitry formed by PMOS transistor P3 and NMOS transistor N3. The gate electrodes of the PMOS transistor P3 and the NMOS transistor N3 are coupled together at the output 24 of the first inverter stage (where the output 24 is at the drain terminals of the transistors P2 and N2). The drain terminal of the transistor P3 is coupled to Gnde. The source terminal of the transistor P3 is coupled to the node at the series connection of the drain terminal of the transistor P1 and the source terminal of transistor P2. The drain terminal of the transistor N3 is coupled to Vdde. The source terminal of the transistor N3 is coupled to the node at the series connection of the source terminal of the transistor N2 and the drain terminal of transistor N1. Although not specifically illustrated, the body terminal of the transistor P3 is coupled to the source of transistor P3 and the body terminal of the transistor N3 is coupled to Gnde.

The Schmitt trigger 21 has a second inverting stage including PMOS transistor P4 and NMOS transistor N4 coupled in series with each other through their source-drain paths. The gate terminals of the transistors P4 and N4 are coupled to the output 24 of the first inverter stage. The source terminal of the transistor P4 is coupled to Vdde. The drain terminal of the transistor P4 is coupled to the drain terminal of the transistor N4 at the output node 26 of the second inverting stage. The source terminal of the transistor N4 is coupled to Gnde. Although not specifically illustrated, the body terminal of the transistor P4 is coupled to Vdde and the body terminal of the transistor N4 is coupled to Gnde.

The Schmitt trigger 21 further has a third inverting stage including PMOS transistor P5 and NMOS transistor N5 that are coupled in series with each other through their source-drain paths. The gate terminals of the transistors P5 and N5 are coupled to the output 26 of the second inverter stage. The source terminal of the transistor P5 is coupled to Vdde. The drain terminal of the transistor P5 is coupled to the drain terminal of the transistor N4 at the output node 28 of the third inverting stage (which is also where the output signal Out of the Schmitt trigger 21 is generated). The source terminal of the transistor N5 is coupled to Gnde. Although not specifically illustrated, the body terminal of the transistor P5 is coupled to Vdde and the body terminal of the transistor N5 is coupled to Gnde.

The Schmitt trigger 21 functions in the following manner: when the input In has a logic high state, the first inverting stage brings the output 24 at the drains of transistors P2 and N2 to Gnde. This is because the voltage of the logic high state causes the transistors P1 and P2 to be nonconducting and causes the transistors N1 and N2 to be conducting. With transistors N1 and N2 conducting, the drain of the transistor N2 is electrically connected to Gnde through the source of the transistor N1. The second inverting stage receives the Gnde voltage from the drains of the transistors P2 and N2 at the gate terminals of the transistors P4 and N4. This Gnde voltage causes the transistor P4 to be conducting and the transistor N4 to be nonconducting. As a result, the voltage at node 26 is brought to Vdde. The third inverting stage receives the Vdde voltage from the drains of the transistors P4 and N4 at the gate terminals of the transistors P5 and N5. This Vdde voltage causes the transistor P5 to be nonconducting and the transistor N5 to be conducting. The output terminal 28 of the Schmitt trigger 20 is therefore electrically connected to Gnde through the source of the transistor N5. Thus, when the input In of the Schmitt trigger 21 receives the voltage at logic high state, the output Out of the Schmitt trigger 21 is at the voltage Gnde for the logic low state. In like manner, when the input In has a voltage at the logic low state, the first inverting stage brings the output 24 at the drains of transistors P2 and N2 to the voltage Vdde. This is because the voltage at the logic low state causes the transistors P1 and P2 to be conducting and the transistors N1 and N2 to be nonconducting. The drain of the transistor P2 is therefore electrically connected to Vdde through the source of the transistor P1. The gate terminals of the transistors P4 and N4 are therefore connected to Vdde. The transistor P4 is thus nonconducting and the transistor N4 is conducting. As a result, the voltage at the output 26 is brought to Gnde. In response, the gate terminals of the transistors P5 and N5 are therefore connected to Gnde. This causes the transistor P5 to be conducting and the transistor N5 to be nonconducting. The output terminal 28 of the Schmitt trigger 21 is therefore connected to Vdde through the source of the transistor P5. Thus, when the input In of the Schmitt trigger 21 receives the voltage at the logic low state, the output Out of the Schmitt trigger 21 is at the voltage Vdde for the logic high state.

Hysteresis is introduced to the Schmitt trigger 21 by means of the transistors P3 and N3 of the feedback circuit. Consider, for example, the case where the input In is at the voltage for the logic low state and the output Out is at the voltage Vdde for the logic high state. The voltage of the logic low state for the input In causes transistors P1 and P2 to be conducting while causing transistors N1 and N2 to be nonconducting. In this case, the drain terminals of the transistors P2 and N1 are at Vdde. This causes transistor N3 to be conducting and transistor P3 to be nonconducting. Because the circuit 21 is formed using conventional CMOS technology, transistor N1 exhibits a body biased effect as its bulk to source voltage is not zero. Thus, transistors N1 and N2 have different threshold voltages from each other. In particular, the threshold voltage of the transistor N2 is increased with respect to the threshold voltage of the transistor N1. Now, if the voltage of the input signal In begins to rise from the logic low state, transistor N1 turns on first when the voltage of the input signal In reaches the threshold voltage of transistor N1. Transistor N2, however, does not turn on as its threshold voltage is higher due to the body biased effect. Hence, the output of the first inverter remains at the voltage Vdde for the logic high state. Transistors N1 and N3 form an inverter having a feedback effect with transistor N3 acting as the pull up device. The source of the transistor N2 is thus connected to the voltage Vdde minus the threshold voltage of transistor N3. As the voltage of the input signal In rises and becomes greater than the threshold voltage of transistor N1, the voltage at the source of transistor N2 begins to fall. When the gate to source voltage of transistor N2 becomes greater than the threshold voltage of transistor N2, then transistor N2 turns ON. The voltage on drain of the transistor N2 begins to decrease, thereby causing the transistor N3 to be less conductive. At this point, the voltage on the drain of the transistor N2 rapidly transitions to the voltage Gnde. The voltage level for the rising input signal In at which the drain of the transistor N2 goes to Gnde is referred to as the high threshold (VIH) voltage value for the circuit 21. This high threshold voltage is set by the width/length (W/L) ratios of transistors N1 and N3.

Because the drains of the transistors N1 and N2 are now at the voltage Gnde, the transistor N3 is entirely nonconducting and the transistor P3 is conducting. In this case, the drain terminals of the transistors P2 and N2 are at Gnde. Because the circuit 21 is formed using conventional CMOS technology, transistor P2 shows a body biased effect as its bulk to source voltage is not zero. Thus, transistors P1 and P2 have different threshold voltages from each other. In particular, the threshold voltage of transistor P2 is increased with respect to the threshold voltage of the transistor P1. As the voltage of the input signal In begins to fall from the voltage of the logic high level, transistor P1 turns on first when the voltage of the input signal In reaches the threshold voltage of transistor P1. Transistor P2 does not turn on as its threshold voltage is higher than the threshold of transistor P1 due to the body biased effect. Hence, the output of the first inverter remains at the logic low level voltage Gnde. This causes transistor P3 to be conducting and transistor N3 to be nonconducting. The transistors P3 and P1 form an inverter having a feedback effect, with transistor P3 acting as the pull down device. When the voltage of the input signal In decreases to a point where transistor P1 begins to conduct, the voltage on the source of transistor P2 begins to rise. When the gate to source voltage of transistor P2 is greater than the threshold voltage of transistor P2, then the transistor P2 turns ON. The voltage on the drain of the transistor P2 begins to increase, causing the transistor P3 to be less conductive. At this point, the voltage on the drain of the transistor P2 rapidly transitions to the voltage Vdde. The voltage level of the input signal In at which the drain of the transistor P2 goes to Vdde is the low threshold (VIL) voltage value for the circuit 21. This low threshold voltage is set by the width/length (W/L) ratios of transistors P1 and P3.

The high and low threshold (VIH, VIL) voltage values can be selected by carefully selecting the width to length ratios of the transistors N1, N3, and transistors P1, P3. As the width to length ratio of the transistor P1 increases with respect to the width to length ratio of the transistor P3, the low threshold value VIL increases from the voltage Gnde. As the width to length ratio of the transistor N1 increases with respect to the width to length ratio of the transistor N3, the high threshold value VIL decreases from the voltage Vdde. Thus, by carefully selecting the width to length ratios of the transistors P1, P3, and transistors N1, N3, appropriate high and low threshold values can be achieved. The high and low threshold values implement hysteresis into the Schmitt trigger 21, thereby reducing the sensitivity of the circuit to noise and jitter.

The RX circuit 20 further includes a level shifter circuit 30. The level shifter circuit 30 is powered from the power supply domain for the peripheral region 14 (power supply voltages Vdde and Gnde) and the power supply domain for the central (core) region 12 (power supply voltages Vdd and Gnd). The level shifter circuit 30 receives the signal Out from the Schmitt trigger 21, shifts the logic high voltage of that signal from Vdde to Vdd, and outputs a level shifted signal Out(ls) for processing by the functional integrated circuits of the central (core) region 12.

It is often the case that the input signal In at the input node 22 from the pad 16*tr* is at a different voltage domain than the power supply domain for the I/O circuits of the peripheral region 14 (power supply voltages Vdde and Gnde). This can occur, for example, in the case where the pad 16*tr* is coupled to a data bus whose logic high voltage for a certain data bus standard is less than the supply voltage Vdde. As an example, consider the case where Vdde is 3.3V and the logic high voltage for the input signal In at the input node 22 is 1.2V (or 1.8V). In this situation, there is a direct current path from supply voltage Vdde to ground Gnde through the series connected transistors P1, P2, N1 and N2 of the first inverting stage of the Schmitt trigger 21 through which a not-insignificant static current consumption is present. As an example, this static current consumption may, for example, be about 20 µA or perhaps 100 µA (depending, of course, design, sizing of transistors and technology). The presence of this static current consumption can make it difficult for the RX circuit 20 of the I/O circuits in the peripheral region 14 to meet certain required operating specifications (like high threshold switch level (VIH), low threshold switch level (VIL), and hysteresis) and/or meet certain required transient specifications (such as duty cycle and static current consumption).

Figure 3:
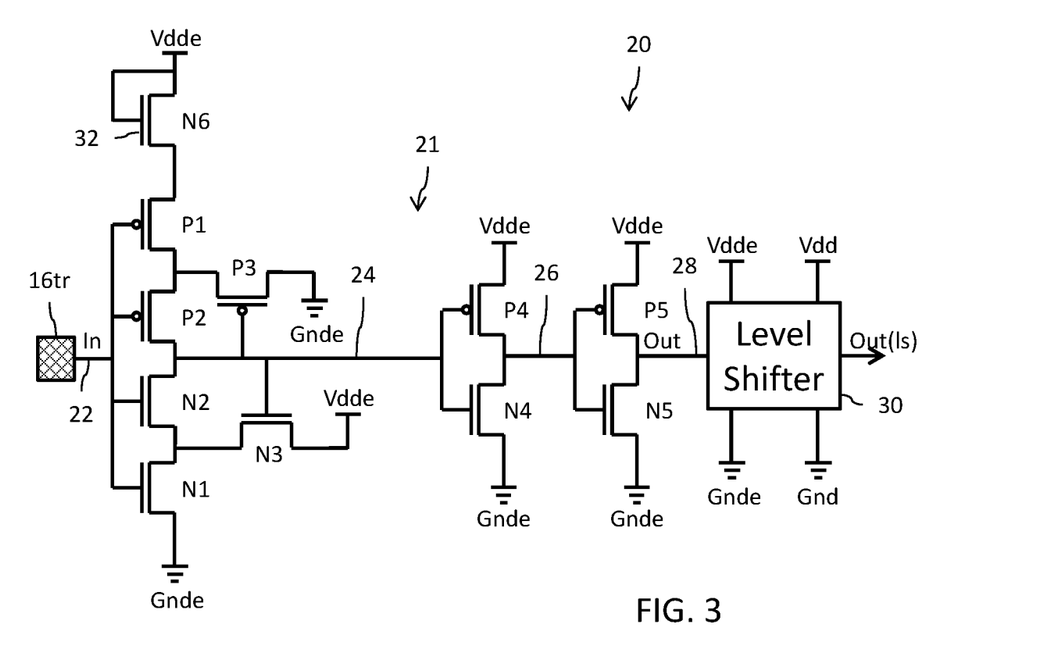
FIG. 3 shows alternate embodiment of the Schmitt trigger circuit.

To address these concerns, FIG. 3 shows a modification of the Schmitt trigger circuit 21 of FIG. 2 to include a diode-connected transistor 32 coupled in series with series connected transistors P1, P2, N1 and N2 of the first inverting stage. In particular, the diode-connected transistor 32 is coupled between the supply voltage Vdde and the source of the PMOS transistor P1. The diode-connected transistor 32 may, for example, be formed by an NMOS transistor N6 having a gate and drain coupled to the supply voltage Vdde and a source coupled to the source of transistor P1. The presence of the diode-connected transistor 32 in the direct current path from supply voltage Vdde to ground Gnde will reduce, but not eliminate, the static current consumption. As an example, this static current consumption may be reduced from the consumption of the circuit shown in FIG. 2, for example. However, the Schmitt trigger circuit 21 of FIG. 3 can still fail to meet the required operating specifications and/or transient specifications across process, voltage and temperature (PVT) variation. Because the receiver circuit is used in a low power application, the static power dissipation is an important specification to be met. Still further, the inclusion of diode-connected transistor 32 has an impact on occupied circuit area.

Figure 4:
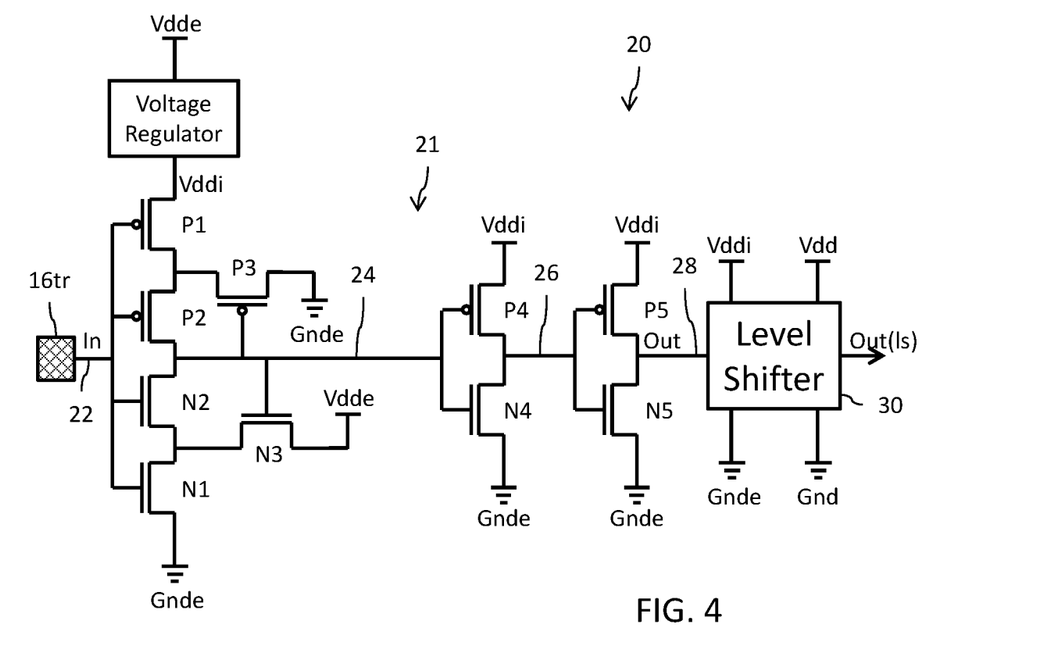
FIG. 4 shows alternate embodiment of the Schmitt trigger circuit.

Another option, as shown in FIG. 4, is to provide a voltage regulator circuit 34 on-chip to generate a supply voltage Vddi for the Schmitt trigger circuit 21 from the power supply voltage Vdde. The generated supply voltage Vddi is selected to be at the same voltage level as the logic high voltage for the certain data bus standard of the signals at pad 16*tr*. As an example, if the logic high voltage for the input signal In at the input node 22 is 1.2V, the voltage regulator circuit 34 would generate Vddi=1.2V. Advantageously, the solution of FIG. 4 substantially addresses the concerns with the circuits of FIGS. 2-3. However, this solution introduces a different problem in that there will be some level of static current consumption in the voltage regulator circuit 34 itself and there is a significant circuit area impact from the inclusion of the voltage regulator circuit 34.

There is accordingly a need in the art for a receiver circuit that addresses the foregoing and other problems.

SUMMARY

In an embodiment, a circuit is configured to receive an input signal having a logic low level at a first voltage and a logic high level at a second voltage. The circuit comprises: a Schmitt trigger circuit having a first power supply node and a second power supply node, where the second power supply node is at the first voltage, and an input node coupled to receive said input signal; a voltage generator circuit configured to generate a reference voltage from a third voltage, wherein the third voltage is higher than the second voltage; and a first transistor coupled between the third voltage and the first power supply node of the Schmitt trigger circuit, wherein a control terminal of the first transistor is biased by the reference voltage, said first transistor configured to apply a fourth voltage to the first power supply node of the Schmitt trigger circuit that is dependent on the reference voltage; wherein the reference voltage has a value which causes the fourth voltage to be less than or equal to the second voltage.

The circuit further comprises a second transistor coupled between a node receiving the input signal and the input of the Schmitt trigger circuit and wherein a control terminal of the second transistor is biased by the reference voltage.

In an embodiment, a capacitor is coupled between the first and second power supply nodes of the Schmitt trigger circuit.

In an embodiment, a current leakage circuit is coupled between the first and second power supply nodes of the Schmitt trigger circuit and configured to leak current from the first power supply node.

BRIEF DESCRIPTION OF THE DRAWINGS

For a better understanding of the embodiments, reference will now be made by way of example only to the accompanying figures in which.

DETAILED DESCRIPTION

Figure 5:
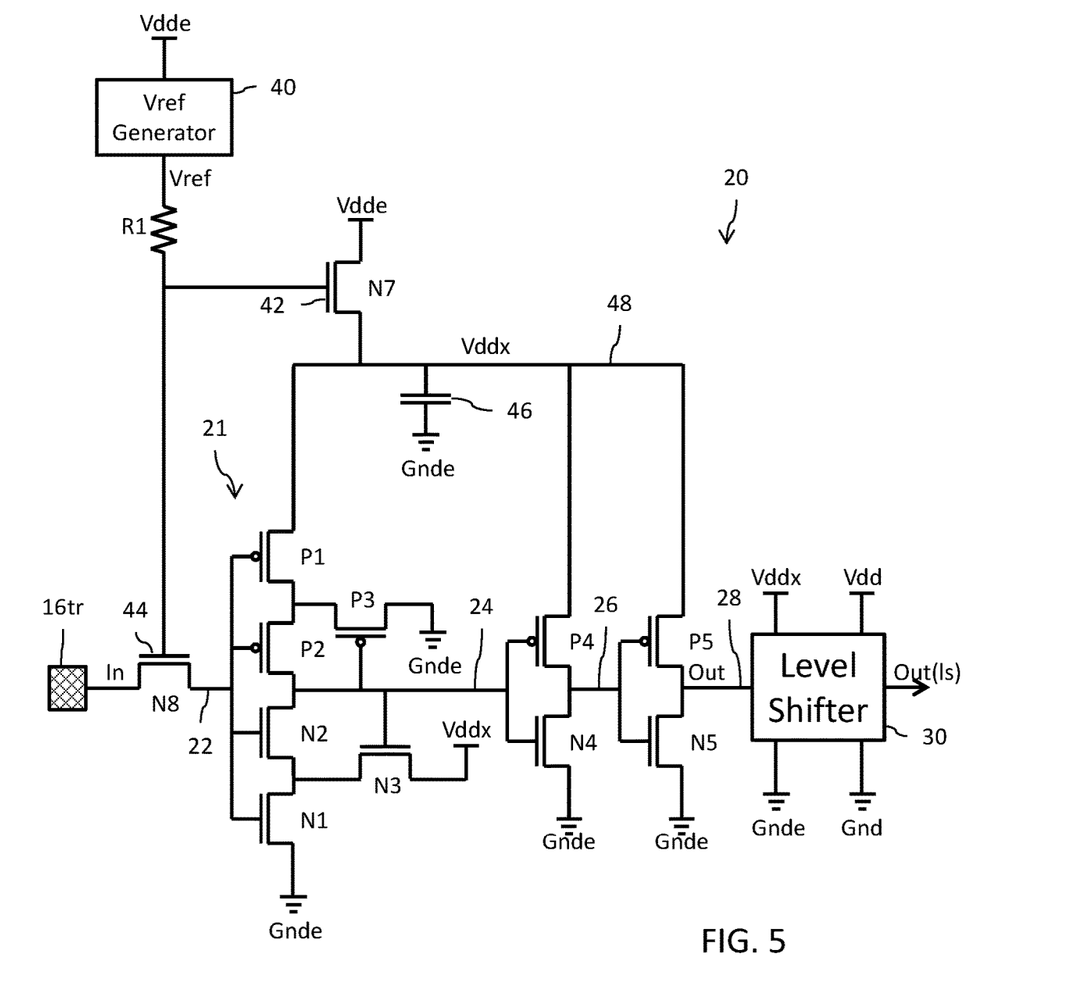
FIG. 5 shows alternate embodiment of the Schmitt trigger circuit.

Reference is made to FIG. 5 which shows a circuit diagram for a receiver (RX) circuit 20 which includes a Schmitt trigger circuit 21. Like reference numbers in FIG. 5 refer to like or same components as shown in FIGS. 1-4, whose description will not be repeated for reasons of brevity. The Schmitt trigger circuit 21 in FIG. 5 differs from the Schmitt trigger circuits as shown in FIGS. 2-4 in the following ways:

A reference voltage generator circuit 40 is powered by Vdde and operates to generate a reference voltage Vref. In an embodiment, the reference voltage generator circuit 40 may comprise a bandgap reference voltage generator circuit. Such a circuit is well-known to those skilled in the art. A resistor R1 is coupled at the output of the reference voltage Vref to attenuate switching noise on the output voltage Vref.

A transistor 42 has its source-drain path coupled in series with series connected transistors P1, P2, N1 and N2 of the first inverting stage at a virtual power supply node 48 for the Schmitt trigger circuit. In particular, the transistor 42 is coupled between the supply voltage Vdde and the source of the PMOS transistor P1 at node 48. The transistor 42 may, for example, be formed by an NMOS transistor N7 having a drain coupled to the supply voltage Vdde and a source coupled to the source of transistor P1. The gate of transistor N7 is biased by the reference voltage Vref output from the reference voltage generator circuit 40. Although not specifically illustrated, the body terminal of the transistor N7 is coupled to the source of transistor N7 or to ground Gnde or some desired bias voltage. The reference voltage Vref is selected such that the voltage Vddx provided by the source of transistor N7 at the virtual power supply node 48 is less than or equal to the logic high voltage for the input signal In. Thus, the sources of transistors P1, P4 and P5 for the Schmitt trigger circuit all receive the voltage Vddx of the virtual power supply node 48 (instead of the higher voltage Vdde as shown, for example, in FIG. 2). In this regard, the voltage Vddx at the virtual power supply node 48 will be Vref−Vt1, where Vt1 is the threshold voltage of the transistor N7. It will be noted that the voltage Vddx is thus independent of the supply voltage Vdde, and thus the Schmitt trigger circuit 21 is operable over a wide range of supply voltage Vdde levels.

A transistor 44 has its source-drain path coupled between the pad 16*tr* and input node 22 at the common gate terminals of the transistors P1, P2, N1 and N2. The transistor 44 may, for example, be formed by an NMOS transistor N8 having a drain coupled to the pad 16*tr* and a source coupled to node 22. The gate of transistor N8 is biased by the reference voltage Vref output from the reference voltage generator circuit 40. Although not specifically illustrated, the body terminal of the transistor N8 is coupled to the source of transistor N8 or to ground Gnde or some desired bias voltage. The biasing of the transistor 44 with the reference voltage Vref ensures that the maximum voltage (i.e., logic high signal voltage) at the input node 22 is Vref−Vt2, where Vt2 is the threshold voltage of the transistor N8.

A capacitor 46 is coupled between the virtual power supply node 48 and Gnde to store charge for producing the voltage Vddx at the virtual power supply node 48. The capacitor 46 may, for example, be formed by an NMOS transistor having a gate coupled to the virtual power supply node 48 and source and drain terminals both coupled to Gnde.

The drain of transistor N3 in the feedback circuit of the Schmitt trigger circuit is coupled to receive the voltage Vddx. Also the level shifter is powered by the voltage Vddx.

The remainder of the circuit is identical to the circuit as shown in FIG. 2.

Operation of the circuit is as follows. When the voltage of the input signal In at the pad 16*tr* is logic low, the signal at node 22 is also at the same logic low voltage. Transistors N1 and N2 are nonconducting and transistors P1 and P2 are conducting. The voltage at the virtual power supply node 48 is Vddx=Vref−Vt1. The signal at node 24 is logic high at the voltage Vddx level. When the voltage of the input signal In at the pad 16*tr* is logic high, the signal at node 22 is also logic high, but is at a voltage level controlled by transistor N8 and reference voltage Vref to be equal to the lower of a) the logic high voltage level of the input signal In, or b) the voltage level Vref−Vt2 (which in most implementations of the circuit will be substantially equal to the voltage Vddx). Transistors N1 and N2 are conducting and transistors P1 and P2 are nonconducting. The signal at node 24 is logic low at the voltage Gnde. The transient operation of the circuit is identical to that described above in connection with FIG. 2, with the exception that the threshold level voltages VIL and VIH for hysteresis will be within the voltage range from Gnde to Vddx.

Figure 6:
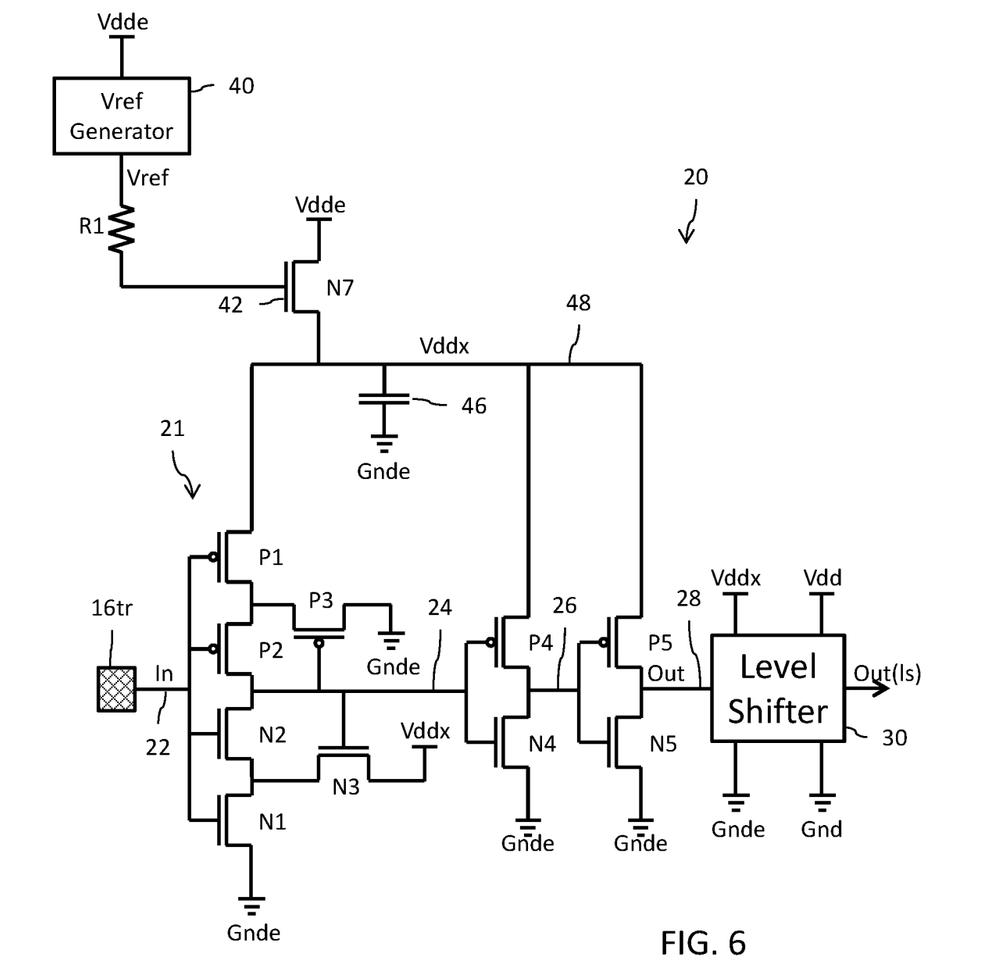
FIG. 6 shows alternate embodiment of the Schmitt trigger circuit.

Reference is made to FIG. 6 which shows a circuit diagram for a receiver (RX) circuit 20 which includes a Schmitt trigger circuit 21. Like reference numbers in FIG. 6 refer to like or same components as shown in FIG. 5, whose description will not be repeated for reasons of brevity. The Schmitt trigger circuit 21 in FIG. 6 differs from the Schmitt trigger circuit as shown in FIG. 5 in the following way: the transistor N8 is omitted. The advantage of the FIG. 6 implementation is by omitting transistor N8 there will be a saving of circuit area. Operation of the circuit in FIG. 6 is more or less the same as with the circuit in FIG. 5. The circuit of FIG. 5 has an advantage over the circuit of FIG. 6 in that the voltages at nodes 22 and 48 are both controlled by the selection of the reference voltage Vref (in the context of the transistor threshold voltages). In the FIG. 6 implementation, the voltage at node 22 is equal to the voltage of the input signal In, and thus there is a limitation on the range of voltages for the signal In.

Figure 7:
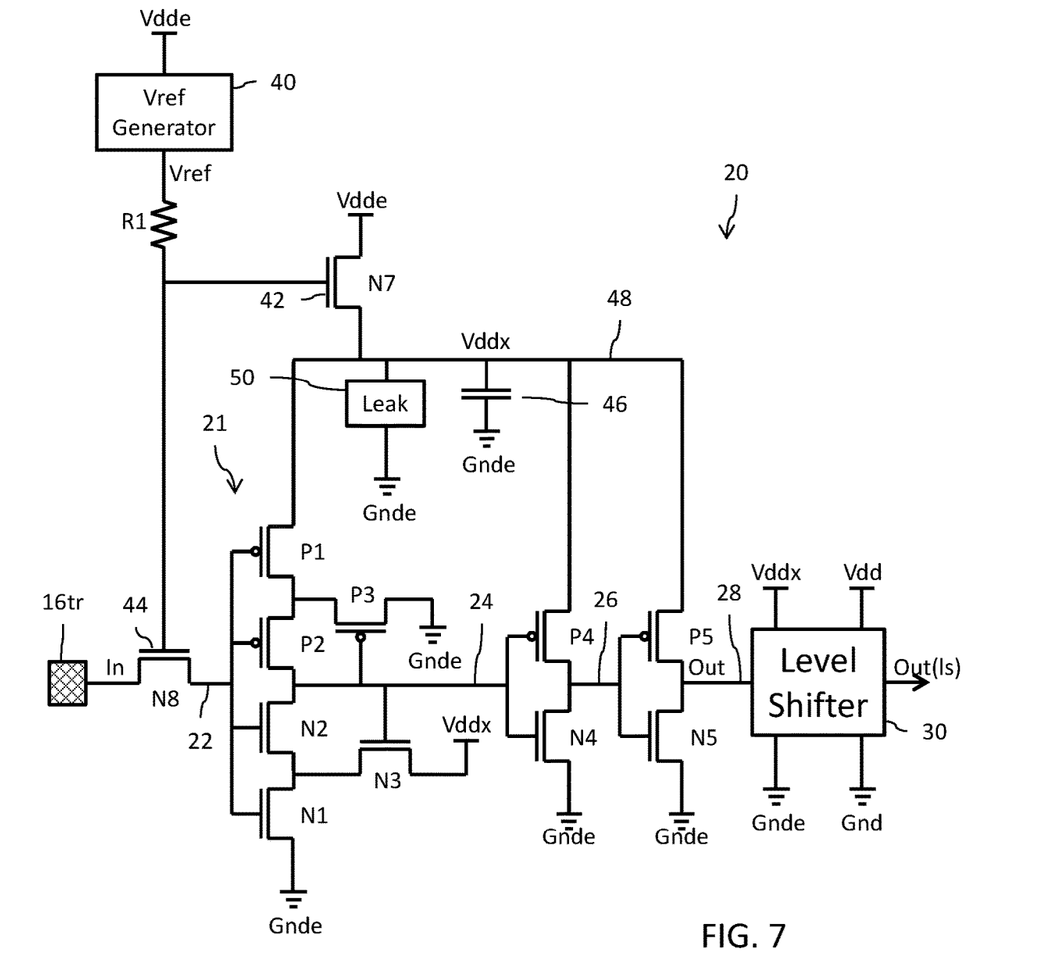
FIG. 7 shows alternate embodiment of the Schmitt trigger circuit.

Reference is made to FIG. 7 which shows a circuit diagram for a receiver (RX) circuit 20 which includes a Schmitt trigger circuit 21. Like reference numbers in FIG. 7 refer to like or same components as shown in FIG. 5, whose description will not be repeated for reasons of brevity. The Schmitt trigger circuit 21 in FIG. 7 differs from the Schmitt trigger circuit as shown in FIG. 5 in the following way: very low leakage circuitry 50 is provided between the virtual power supply node 48 and Gnde (i.e., in parallel with capacitor 46). The very low leakage circuitry 50 may, for example, be formed by an NMOS transistor having a gate coupled to its source at Gnde and a drain coupled to the virtual power supply node 48. The very low leakage circuitry 50 is accordingly implemented in this case as a grounded gate n-channel transistor (GGNMOS—i.e., gate tied to source at the ground node) which provides a very low drain to source current leakage path from node 48 to ground. This circuit is provided to prevent an undesireable rise in the voltage level (Vddx) at the virtual power supply node 48 to reach the voltage (Vdde) for the power supply domain in the peripheral region.

In the context herein, the term "about" when referring to a voltage means that the voltage is within plus or minus 5 to 10 percent of the nominally recited voltage value.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit configured to receive an input signal having a logic low level at a first voltage and a logic high level at a second voltage, comprising:

a Schmitt trigger circuit having a first power supply node and a second power supply node, where the second power supply node is at the first voltage, and an input node coupled to receive said input signal;

a voltage generator circuit configured to generate a reference voltage from a third voltage, wherein the third voltage is higher than the second voltage; and a first transistor coupled between the third voltage and the first power supply node of the Schmitt trigger circuit, wherein a control terminal of the first transistor is biased by the reference voltage, said first transistor configured to apply a fourth voltage to the first power supply node of the Schmitt trigger circuit that is dependent on the reference voltage;

wherein the reference voltage has a value which causes the fourth voltage to be less than or equal to the second voltage.

2. The circuit of claim 1, further comprising a capacitor coupled between the first and second power supply nodes of the Schmitt trigger circuit.

3. The circuit of claim 2, wherein the capacitor is formed by a MOS transistor having a gate terminal coupled to the first power supply node, and source and drain terminals coupled to the second power supply node.

4. The circuit of claim 2, further comprising leakage circuitry configured to leak current from the first power supply node to the second power supply node.

5. The circuit of claim 4, wherein the leakage circuitry is a grounded gate transistor.

6. The circuit of claim 5, wherein the grounded gate transistor is a grounded gate NMOS transistor.

7. The circuit of claim 1, wherein the first transistor comprises a MOS transistor having a gate terminal coupled to receive the reference voltage, a drain terminal coupled to receive the third voltage and a source terminal coupled to supply the fourth voltage.

8. The circuit of claim 1, further comprising:
a second transistor coupled between a node receiving the input signal and the input of the Schmitt trigger circuit and wherein a control terminal of the second transistor is biased by the reference voltage.

9. The circuit of claim 8, wherein the second transistor comprises a MOS transistor having a gate terminal coupled to receive the reference voltage, a drain terminal coupled to the node receiving the input signal and a source terminal coupled to the input of the Schmitt trigger circuit.

10. The circuit of claim 8, wherein the second transistor causes the logic high level of the input signal at the input node of the Schmitt trigger circuit to be the lower of: a) the second voltage or b) the reference voltage minus a threshold voltage of the second transistor.

11. The circuit of claim 8, further comprising a resistor coupled between an output of the voltage generator circuit and the control terminal of the second transistor.

12. The circuit of claim 1, further comprising:
a level shifting circuit configured to level shift an output signal of the Schmitt trigger circuit from a logic high level at the fourth voltage to a different logic high level voltage.

13. The circuit of claim 1, wherein the first voltage is ground, the second voltage is about 1.2V, and the third voltage is about 3.3V.

14. The circuit of claim 1, wherein the fourth voltage is equal to the reference voltage minus a threshold voltage of the first transistor.

15. The circuit of claim 1, further comprising a resistor coupled between an output of the voltage generator circuit and the control terminal of the first transistor.

16. The circuit of claim 1, wherein the Schmitt trigger circuit comprises:
a first inverter stage coupled between the first power supply node and a second power supply node, the first inverter stage having an input configured to receive the input signal and an output and further including a first feedback transistor having a control terminal coupled to the output of the first inverter stage with a feedback connection to a first node of the first inverter stage between the output and the first power supply node and a second inverter stage with a feedback connection to a second node of the first inverter stage between the output and the second power supply node; and
a second inverter stage coupled between the first power supply node and a second power supply node, the second inverter stage having an input coupled to the output of the first inverter stage and an output.

17. The circuit of claim 16, wherein the Schmitt trigger circuit further comprises:
a third inverter stage coupled between the first power supply node and a second power supply node, the third inverter stage having an input coupled to the output of the second inverter stage and an output.

18. The circuit of claim 16, wherein the first inverter stage comprises:
first and second transistors of a first conductivity type series connected at the first node and coupled between the first power supply node and the output of the first inverter stage, said first and second transistors of the first conductivity type having control terminals coupled to receive the input signal; and
third and fourth transistors of a second conductivity type series connected at the second node and coupled between the second power supply node and the output of the first inverter stage, said third and fourth transistors of the second conductivity type having control terminals coupled to receive the input signal.

19. The circuit of claim 18, wherein the first feedback transistor is coupled to receive the first voltage and wherein the second feedback transistor is coupled to receive the fourth voltage.

20. The circuit of claim 19, wherein the first feedback transistor is a PMOS transistor having a drain coupled to receive the first voltage and a source coupled to the first node and wherein the second feedback transistor is an NMOS transistor having a drain coupled to receive the fourth voltage and a source coupled to the second node.

* * * * *